(12) United States Patent
Simin et al.

(10) Patent No.: US 9,948,062 B2
(45) Date of Patent: Apr. 17, 2018

(54) SOLID-STATE LIGHTING STRUCTURE WITH LIGHT MODULATION CONTROL

(71) Applicant: Sensor Electronic Technology, Inc., Columbia, SC (US)

(72) Inventors: Grigory Simin, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/263,731

(22) Filed: Sep. 13, 2016

(65) Prior Publication Data
US 2017/0079102 A1    Mar. 16, 2017

Related U.S. Application Data

(60) Provisional application No. 62/218,073, filed on Sep. 14, 2015.

(51) Int. Cl.
| | |
|---|---|
| *H01L 33/00* | (2010.01) |
| *H01S 5/062* | (2006.01) |
| *H01L 33/20* | (2010.01) |
| *H01S 5/06* | (2006.01) |
| *H01L 33/14* | (2010.01) |

(Continued)

(52) U.S. Cl.
CPC .......... *H01S 5/062* (2013.01); *H01L 33/0004* (2013.01); *H01L 33/14* (2013.01); *H01L 33/20* (2013.01); *H01L 33/36* (2013.01); *H01L 33/38* (2013.01); *H01S 5/0421* (2013.01); *H01S 5/0602* (2013.01); *H01S 5/06203* (2013.01); *H01L 33/08* (2013.01); *H01L 33/32* (2013.01);

(Continued)

(58) Field of Classification Search
CPC .... H01S 5/062; H01S 5/0602; H01S 5/06203; H01L 33/18; H01L 33/14; H01L 33/36
See application file for complete search history.

(56) References Cited

U.S. PATENT DOCUMENTS

| | | | |
|---|---|---|---|
| 4,837,526 A | 6/1989 | Suzuki et al. | |
| 4,845,535 A * | 7/1989 | Yamanishi | H01L 33/0025 257/13 |

(Continued)

OTHER PUBLICATIONS

Sze, et al., "Physics of Semiconductor Devices," Description and Table of Contents, Accessed on Sep. 8, 2016, 5 pages, ISBN-13: 978-0471143239.

*Primary Examiner* — Jamie C Niesz
(74) *Attorney, Agent, or Firm* — LaBatt, LLC

(57) ABSTRACT

A solid-state light source (SSLS) with light modulation control is described. A SSLS device can include a main p-n junction region configured for recombination of electron-hole pairs for light emission. A supplementary p-n junction region is proximate the main p-n junction region to supplement the recombination of electron-hole pairs, wherein the supplementary p-n junction region has a smaller electron-hole life time than the electron-hole life time of the main p-n junction region. The main p-n junction region and the supplementary p-n junction region operate cooperatively in a light emission state and a light turn-off-state. In one embodiment, the recombination of electron-hole pairs occurs in the main p-n junction region during a light emission state, and the recombination of electron-hole pairs occurs in the supplementary p-n junction region light during the light turn off-state.

19 Claims, 8 Drawing Sheets

(51) Int. Cl.
*H01L 33/36* (2010.01)
*H01S 5/042* (2006.01)
*H01L 33/38* (2010.01)
H01L 33/08 (2010.01)
H01L 33/32 (2010.01)
H01S 5/343 (2006.01)

(52) U.S. Cl.
CPC ......... *H01S 5/0427* (2013.01); *H01S 5/34333* (2013.01)

(56) References Cited

U.S. PATENT DOCUMENTS

| | | | | |
|---|---|---|---|---|
| 6,128,324 A | * | 10/2000 | Shah | H01S 5/062 257/134 |
| 6,144,043 A | * | 11/2000 | Ogihara | H01L 27/15 257/88 |
| 8,970,126 B2 | * | 3/2015 | Feng | H01L 33/58 257/98 |
| 2014/0036950 A1 | * | 2/2014 | Walter | B82Y 20/00 372/45.01 |
| 2014/0134917 A1 | * | 5/2014 | Wells | A63H 17/28 446/484 |

\* cited by examiner

SOLID-STATE LIGHTING STRUCTURE WITH LIGHT MODULATION CONTROL

REFERENCE TO RELATED APPLICATIONS

The present patent application claims the benefit of U.S. Provisional Application No. 62/218,073, which was filed on 14 Sep. 2015, and which is hereby incorporated by reference.

TECHNICAL FIELD

The present invention relates generally to solid-state lighting, and more particularly, to solid-state lighting structures (SSLSs), such as light emitting diodes (LEDs) and lasers, with light modulation control that enables a faster on/off switching time.

BACKGROUND ART

A great deal of interest has been focused on SSLSs, such as LEDs and lasers, and in particular, those that emit light in the blue and deep ultraviolet (UV) wavelengths. These devices may be capable of being incorporated into various applications, including solid-state lighting, biochemical disinfection and detection, high-density data storage, and the like.

Modern SSLSs, such as an LEDs, typically include three major components: an electron supply layer (e.g., an n-type semiconductor layer), a hole supply layer (e.g., a p-type semiconductor layer), and a light generating structure formed between the electron supply layer and the hole supply layer. A number of these SSLSs are used in applications that require a fast on/off switching time of the SSLSs, such as in a nanosecond or sub-nanosecond range. In group III-nitride based SSLSs, such as group III-nitride LEDs, the light turn-off time is limited by the recombination of electron-hole pairs injected into the p-n junctions and the light generating structure regions of the devices. A piezoelectric effect, certain type of traps, and other factors associated with the LEDs, cause the recombination of electron and holes to take a relatively long time after a pumping current has been shut off. A longer recombination of electrons and holes after the pumping current has been shut off translates into a protracted light turn-off time. Deep UV LEDs can also have a relatively long light turn-off time due to the recombination of electrons and holes.

Attempts to improve the fast on/off switching times of the SSLSs have been proposed in order to satisfy applications with faster light modulation (e.g., light being turned off). One approach involves the SSLSs having the device p-n junction regions with an increased defect concentration. A higher defect concentration in the device p-n junction region typically leads to a faster recombination rate of electrons and holes, which translates into faster switching. However, this approach inevitably results in lower light emission and lower LED efficiency. Another approach involves using external light modulators with the SSLSs. However, modulation with an external light modulator involves additional optical loss, power consumption, and leads to significant increase in the overall size, weight and cost of the SSLS devices.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the present invention are directed to improving the light modulation of SSLSs, e.g., by attaining faster on/off switching times, and thus, improved performance of the SSLSs. In one embodiment, a device can include an SSLS having a main p-n junction region configured for recombination of electron-hole pairs for light emission, and at least one supplementary p-n junction region proximate the main p-n junction region to supplement the recombination of electron-hole pairs. The supplementary p-n junction region can supplement the recombination of electron-hole pairs by redirecting the electron-hole flow direction away from the light generating structure of the device, which leads to faster light turn-off. In addition, the supplementary p-n junction region can have a smaller electron-hole life time than the electron-hole life time of the main p-n junction region, which also leads to faster light turn-off. In one embodiment, the electron-hole life time of the supplementary p-n junction region is 10 to 100 times smaller than the electron-hole life time of the main p-n junction region. The main p-n junction region and the supplementary p-n junction region can operate cooperatively in a light emission state and a light turn-off-state. In one embodiment, the recombination of electron-hole pairs can occur in the main p-n junction region during the light emission state, and the recombination of electron-hole pairs can occur in the supplementary p-n junction region during the light turn off-state.

A pair of main electrodes can be formed over the main p-n junction region and a supplementary electrode can be formed over the supplementary p-n junction region. In one embodiment, the pair of main electrodes and the main p-n junction region can form a main current path, while the supplementary electrode and one of the main electrodes along with the supplementary p-n junction region can form a current redirection path. A bias can be applied through either the main current path to the main p-n junction region or the current redirection path to the supplementary p-n junction region. For example, the bias can be applied through the main current path to the main p-n junction region in a light emission state, while the bias can be applied through the current redirection path to the supplementary p-n junction region in a light turn-off state. Because the supplementary p-n junction region can have a smaller electron-hole life time than the main p-n junction region, the recombination of pairs of electrons and holes occurs faster. This enables the supplementary p-n junction region to have a faster light modulation, and thus, is well suited for use in the light turn-off state as opposed to the main p-n junction region which is more suitable for use in the light emission state.

A switching circuit can be used to switch a bias applied to the main p-n junction region through the main current path during the light emission state to the supplementary p-n junction region through the current redirection path during a light turn off-state. The switching circuit can apply the bias to the main p-n region and the supplementary p-n junction region through their respective paths in a variety of directions. For example, the switching circuit can apply bias to the supplementary p-n junction region in a forward direction in the light turn-off state while disconnecting the main current path. In one embodiment, the switching circuit can apply the bias to the main p-n junction region in a reverse direction while simultaneously applying the bias to the supplementary p-n junction region in a forward direction in the light turn-off state. In another embodiment, the switching circuit can apply a bias to the main p-n junction region in a reverse direction while simultaneously applying a bias to the supplementary p-n junction region in a reverse direction in the light turn-off state.

A first aspect of the invention provides a solid-state light structure (SSLS) device, comprising: a main p-n junction region configured for recombination of electron-hole pairs for light emission; and a supplementary p-n junction region proximate the main p-n junction region to supplement the recombination of electron-hole pairs, the supplementary p-n junction region having a smaller electron-hole life time than the electron-hole life time of the main p-n junction region; wherein the electron-hole life time of the supplementary p-n junction region is 10 to 100 times smaller than the electron-hole life time of the main p-n junction region.

A second aspect of the invention provides a device, comprising: a solid-state lighting structure (SSLS) including an n-type semiconductor layer; a p-type semiconductor layer; and a light generating structure formed between the n-type semiconductor layer and the p-type semiconductor layer; a main p-n junction region formed within the SSLS, for electron-hole pair recombination and light emission therefrom; at least one supplementary p-n junction region proximate the main p-n junction region to supplement the recombination of electron-hole pairs, the supplementary p-n junction region including a region of semiconductor material formed on a surface of one of the n-type semiconductor layer and the p-type semiconductor layer; a pair of main electrodes formed over the main p-n junction region, wherein one of the electrodes is formed over the p-type semiconductor layer and another of the main electrodes is formed over the n-type semiconductor layer; a supplementary electrode formed over the supplementary p-n junction region; a main current path formed from the main p-n junction region and the pair of main electrodes; and a current redirection path formed from the supplementary electrode and one of the main electrodes along with the supplementary p-n junction region.

A third aspect of the invention provides a method, comprising: fabricating a device, comprising: a solid-state lighting structure (SSLS) including an n-type semiconductor layer; a p-type semiconductor layer; and a light generating structure formed between the n-type semiconductor layer and the p-type semiconductor layer; a main p-n junction region formed within the SSLS, for electron-hole pair recombination and light emission therefrom; at least one supplementary p-n junction region proximate the main p-n junction region to supplement the recombination of electron-hole pairs, the supplementary p-n junction region including a region of semiconductor material formed on a surface of one of the n-type semiconductor layer and the p-type semiconductor layer; a pair of main electrodes formed over the main p-n junction region, wherein one of the electrodes is formed over the p-type semiconductor layer and another of the main electrodes is formed over the n-type semiconductor layer; a supplementary electrode formed over the supplementary p-n junction region; a main current path formed from the main p-n junction region and the pair of main electrodes; and a current redirection path formed from the supplementary electrode and one of the main electrodes along with the supplementary p-n junction region.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the present invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
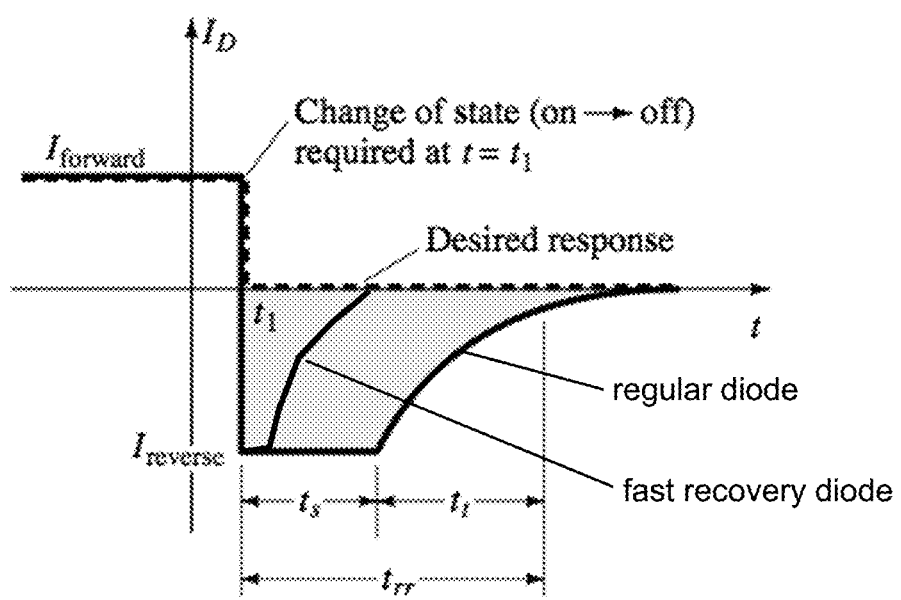
FIG. 1 shows an illustrative time response of regular and fast recovery p-n junction diodes according to the prior art.

The various embodiments are directed to SSLSs with light modulation control to attain faster on/off switching times. In one embodiment, an SSLS can have a main p-n junction region for recombination of electron-hole pairs for light emission and a supplementary p-n junction region proximate the main p-n junction region to supplement the recombination of electron-hole pairs. The supplementary p-n junction region can have a smaller electron-hole life time than the electron-hole life time of the main p-n junction region. In addition, the supplementary p-n junction region can serve to redirect the electron-hole flow direction away from the light generating structure of the device. With this configuration, the main p-n junction region and the supplementary p-n junction region can operate cooperatively in a light emission state and a light turn-off-state for faster light modulation. In one embodiment, the recombination of electron-hole pairs can occur in the main p-n junction region during a light emission state, and the recombination of electron-hole pairs can occur in the supplementary p-n junction region during the light turn off-state. The recombination of pairs of electrons and holes occurs faster in the light turn-off state in the supplementary p-n junction because it can have a smaller electron-hole life time than the main p-n junction region. This enables the various embodiments described to have a faster light modulation.

As used herein, a SSLS is any device, such as a diode that, under normal operating conditions, operates in a forward-bias mode. The SSLS can include of a multitude of SSLSs such as for example, a p-n junction SSLS, a multiple-quantum well SSLS and a heterojunction SSLS. In one embodiment, the SSLS can include any type of semiconductor LED such as conventional and super luminescent LEDs, light emitting solid state lasers, laser diodes, and/or the like. These examples of SSLSs can be configured to emit electromagnetic radiation from a light generating structure such as an active region upon application of a bias. The electromagnetic radiation emitted by these SSLSs can comprise a peak wavelength within any range of wavelengths, including visible light, ultraviolet radiation, deep ultraviolet radiation, infrared light, and/or the like. For example, these SSLSs can emit radiation having a dominant wavelength within the ultraviolet range of wavelengths. As an illustration, the dominant wavelength can be within a range of wavelengths of approximately 210 nanometers (nm) to approximately 350 nm.

Any of the various layers that form the SSLSs can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by the SSLS (e.g., peak emission wavelength +/−five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A layer of the SSLS can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof.

Turning to the drawings, FIG. 1 shows an illustrative time response of regular and fast recovery p-n junction diodes according to the prior art. FIG. 1 shows that the response time for a regular diode with a typical p-n junction to shut off in a light turn-off state is slower than the response time for a diode with faster modulation. As noted herein, these SSLSs with faster light modulation can have lower light emission and lower LED efficiency. Plus, some SSLSs that use external light modulators have optical loss with power consumption in addition to a significant increase in the overall size, weight and cost of the devices. Furthermore, some of these SSLSs with faster modulation are not fast enough for newer SSLS applications that require faster on/off switching of the SSLSs.

Figure 2A:
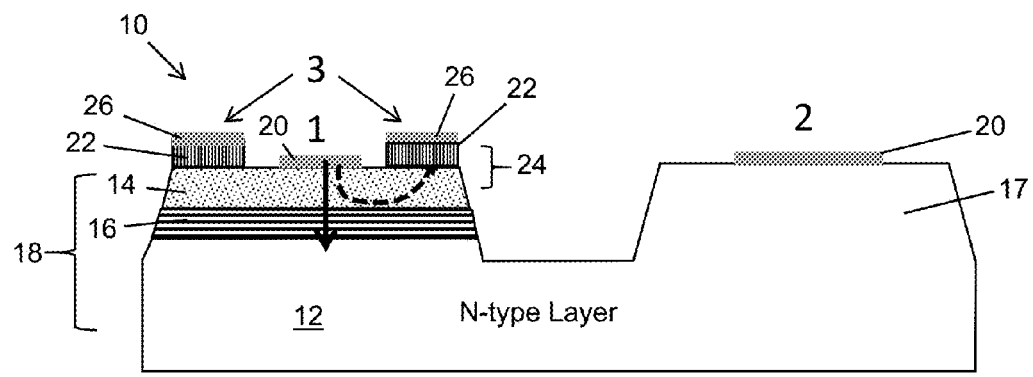
FIGS. 2A-2B show schematic views of an SSLS with a main p-n junction region and a supplementary p-n junction region for fast light modulation according to one embodiment.
Figure 2B:
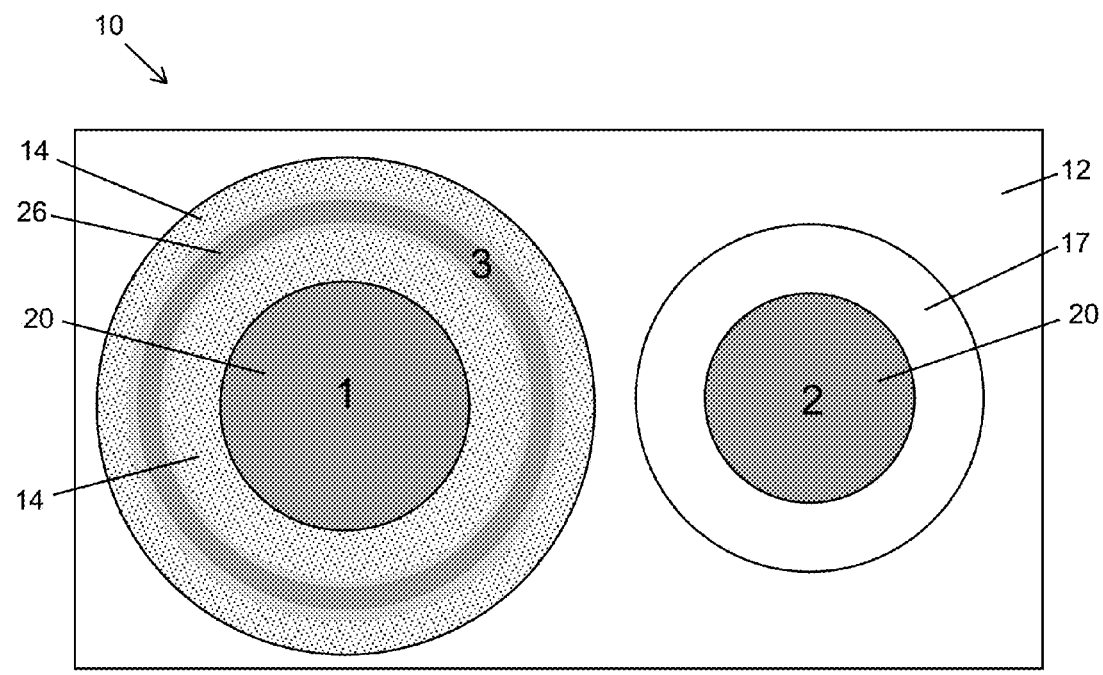

FIGS. 2A-2B show schematic views of an SSLS 10 having fast light modulation control according to one embodiment. As shown in the cross-sectional view of FIG. 2A, the SSLS 10 can include an n-type semiconductor layer 12 (e.g., an electron supply layer), a p-type semiconductor layer 14 (e.g., a hole supply layer) and a light generating structure 16 (e.g. a multi-quantum well) formed between the n-type semiconductor layer 12 and the p-type semiconductor layer 14. FIG. 2A shows that the n-type semiconductor layer 12 can include a mesa portion 17 that is spaced apart from a second mesa structure including the p-type semiconductor layer 14 and the light generating structure 16. In one embodiment, a main p-n junction region 18 can be formed within the SSLS 10 from the n-type semiconductor layer 12, the light generating structure 16 and the p-type semiconductor layer 14, for electron-hole pair recombination and light emission. A pair of main electrodes 20 can be formed over the main p-n junction region 18, wherein one of the main electrodes 20 is formed over the p-type semiconductor layer 14 and another of the main electrodes is formed over the n-type semiconductor layer 12.

As shown in FIG. 2A, at least one region of semiconductor material 22 can be formed on a top surface of the SSLS 10. For example, a region of n-type semiconductor material 22 can be formed on a top surface of the p-type semiconductor layer 14. In one embodiment, the semiconductor material 22 can be formed about one of the main electrodes 20. In another embodiment, at least one supplementary p-n junction region 24 can be formed from each region of semiconductor material 22 disposed on the p-type semiconductor layer 14. In this manner, the supplementary p-n junction region 24 is proximate the main p-n junction region 18 and can supplement the recombination of electron-hole pairs. FIG. 2A shows that a supplementary electrode 26 can be formed over each supplementary p-n junction region 24. In one embodiment, the supplementary electrode 26 can include an ohmic contact which allows the application of voltage to the supplementary p-n junction region 24.

The SSLS 10 can have various current paths formed therein. In one embodiment, a main current path can be formed from the main p-n junction region 18 and the pair of main electrodes 20, while a current redirection path can be formed from the supplementary electrode 26 and one of the main electrodes 20 along with the supplementary p-n junction region 24. For clarity in depicting these current paths within the SSLS 10, the main current path can be represented in FIGS. 2A-2B by the flow from reference numeral 1 (left-hand electrode 20) to reference numeral 2 (right-hand electrode 20) by the flow arrow. Similarly, the current redirection path can be represented in FIGS. 2A-2B by the dashed flow from reference numeral 1 (left-hand electrode 20) to reference numeral 3 (one of the electrodes 26 formed on the region of semiconductor material 22).

Although not illustrated in FIGS. 2A-2B, the SSLS 10 can be formed on a substrate with an optional buffer formed between the SSLS and the substrate. In one embodiment, the substrate can include sapphire, silicon carbide (SiC), silicon (Si), GaN, AlGaN, AlON, LiGaO$_2$, or another suitable material. In another embodiment, the substrate can include a non-conductive or insulating substrate. Examples of a non-conductive or insulating substrate can include sapphire, diamond, highly resistive silicon, highly-resistive SiC, highly resistive GaN, and/or the like. In one embodiment, the buffer layer can include AlN, an AlGaN/AlN superlattice, and/or the like.

The SSLS 10, including the n-type semiconductor layer 12, the light generating structure 16, the p-type semiconductor layer 14, the main p-n junction region 18 and the supplementary p-n junction region 24 can be a group III-V materials based-device, in which some or all of the various layers are formed of elements selected from the group III-V materials system. In a more particular illustrative embodiment, the various layers of the SSLS 10 can be formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials can include binary, ternary and quaternary alloys such as, AlN, GaN, InN, GaAs, GaInP, BN, AlGaN, AlInGaN, AlInN, AlBN, AlGaInN, AlGaBN, AlInBN, and AlGaInBN with any molar fraction of group III elements.

An illustrative embodiment of a group III nitride based light generating structure 16 that includes a multi-quantum well (e.g., a series of alternating quantum wells and barriers) can comprise $In_yAl_xGa_{1-x-y}N$, $Ga_zIn_yAl_xB_{1-x-y-z}N$, an $Al_xGa_{1-x}N$ semiconductor alloy, or the like. Similarly, both the n-type semiconductor layer 12 and the p-type semiconductor layer 14 and can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 12, 14, and 116.

The SSLS 10 can operate in the following manner with light modulation time control. In a light emission state, the SSLS 10 can operate in a continuous (CW) mode such that a bias provided by a voltage supply can be applied between the pair of main electrodes 20 via the main current path (i.e., electrodes 1 and 2 in FIGS. 2A-2B). In a conventional SSLS, the modulation is achieved by interrupting the current flowing between the pair of main electrodes 20 (i.e., electrodes 1 and 2). However, this type of switching does not lead to instantaneous light modulation because additional time is needed for the accumulated electron—hole pairs to recombine. In this case, the light continues to emit until the recombination process is over.

The SSLS 10 as well as those of the various other embodiments described herein obtain a faster or more instantaneous light modulation than a conventional SSLS due to the use of the supplementary p-n junction region 24. In one embodiment, the supplementary p-n junction region 24 can have a smaller electron-hole life time (i.e., an average time before the electron-hole pair recombines) than the electron-hole life time of the main p-n junction region. In one embodiment, the electron-hole life time of the supplementary p-n junction region 24 is 10 to 100 times smaller than the electron-hole life time of the main p-n junction region 18. An electron-hole life time of this magnitude for the supplementary p-n junction region 24 means that the electron-holes that remain upon entering a light turn-off state can recombine much faster than in a p-n junction region such as the main p-n junction region 18.

With this difference in the electron-hole life time, the main p-n junction region 18 and the supplementary p-n junction region 24 can operate cooperatively in a light emission state and a light turn-off-state. For example, the recombination of electron-hole pairs can occur in the main p-n junction region 18 during the light emission state, while the recombination of electron-hole pairs can occur in the supplementary p-n junction region 24 during the light turn off-state.

When the operation of the SSLS 10 transitions from the light emission state to the light turn-off state, the current flow is being redirected from the main current path (i.e., electrode 1 to electrode 2 in FIGS. 2A-2B), including the light generating structure 16, to the current redirection path (i.e., electrode 1 to electrode 3). In one embodiment, the current redirection path from the supplementary electrode 26 to one of the main electrodes 20 (i.e., electrode 1 to electrode 3) can have a high defect concentration in the supplementary p-n junction region 24 which can lead to a faster recombination rate, and thus, a faster modulation. As used herein, a high defect concentration means a defect concentration comparable with the doping level in the p- or n-layer of the SSLS 10. In an embodiment, this corresponds to a defect concentration in the range of $10^{16}$ cm$^{-3}$ or higher. In one embodiment, the defect concentration in the supplementary p-n junction region 24 can be about $10^{17}$ cm$^{-3}$ or higher, while the defect concentration of the main p-n junction region 18 can be about $10^{15}$ cm$^{-3}$ or lower. Having the supplementary p-n junction region 24 with a higher defect concentration and a shorter electron-hole life time in comparison to the main p-n junction region 18, enables the electron-hole pairs to recombine at a much faster rate after the current path has been changed from the main current path away from the light generating structure 16 to the current redistribution path. Therefore, the accumulated electron-hole pairs recombine much faster in the supplementary p-n junction region 24, resulting in the SSLS 10 having faster light modulation (e.g., light being turned off).

It is understood that the SSLS 10 as depicted in FIGS. 2A-2B is representative of one possible configuration and is not meant to limit the possibility of various other alternatives that may be utilized in order to attain the desired faster light modulation. For example, instead of having the n-type semiconductor layer 12 as the bottom portion of the SSLS, the p-type semiconductor 14 can be deployed as the bottom portion, while the n-type semiconductor layer 12 can be formed on the opposing side of the light generating structure 16. Similarly, instead of having the region of semiconductor material 22 with n-type conductivity as depicted in FIGS. 2A-2B, it is possible to have the semiconductor material with p-type conductivity.

In another embodiment, the region of semiconductor material 22 can have the same type of conductivity as the layer on which it is formed. In this embodiment, the materials 14 and 22 do not form a p-n junction and light modulation is rather achieved due to redirection of the current flow from the center of the mesa towards its edges. At the edges, due to surface states and defects, the rate of non-radiative recombination is much higher than that in the center of the mesa and hence light emission decreases.

In addition, the amount of space that the region of semiconductor material 22 extends along the layer on which it is formed can vary. For example, the region of semiconductor material 22 can extend partially or fully over the top surface of the underlying layer that it is formed on. Also, it is understood that the shape of the main electrodes 20 and the supplementary electrode 26 as well as the shape of the device regions (e.g., the n-type semiconductor layer 12, light generating structure 16, the p-type semiconductor layer 14, the main p-n junction region 18, the supplementary p-n junction region 24) that form the SSLS 10 can have different geometries than the circular shapes depicted in FIG. 2B.

Figure 3:
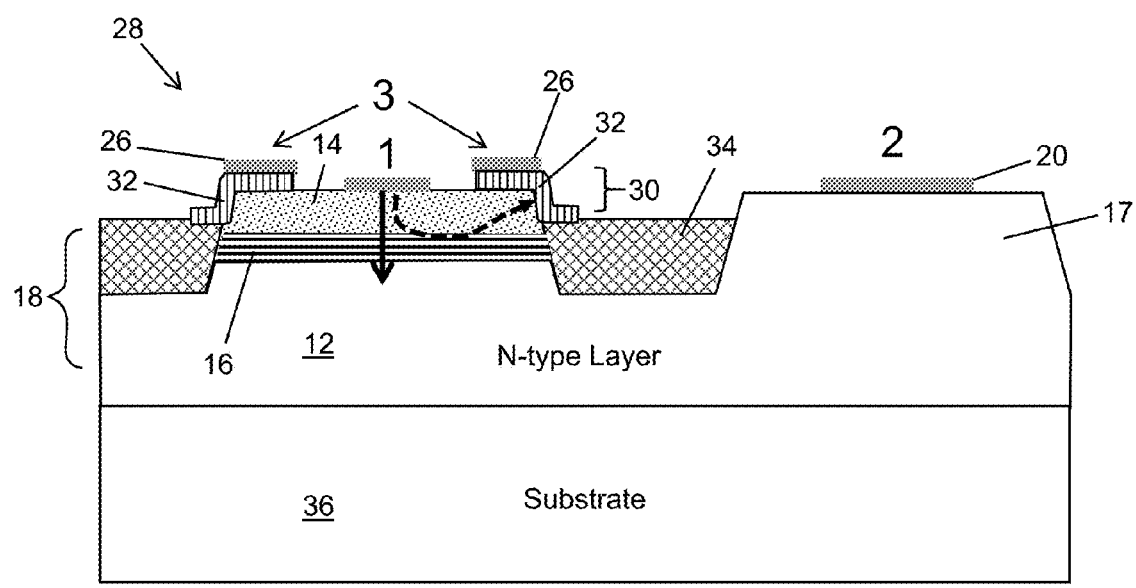
FIG. 3 shows a schematic cross-sectional view of an SSLS with a main p-n junction region and an alternative supplementary p-n junction region for fast light modulation according to according to an embodiment.

FIG. 3 shows a schematic cross-sectional view of an SSLS 28 with the main p-n junction region 18 and an alternative supplementary p-n junction region 30 for fast light modulation according to according to an embodiment. In this embodiment, the alternative supplementary p-n junction region 30 can include a region of semiconductor material 32 that differs from the semiconductor material 22 depicted in FIG. 2A. In this embodiment, the region of semiconductor material 32 of the supplementary p-n junction region 30 can be formed on a portion of a top surface of the p-type semiconductor layer 14 where it extends along the top surface and wraps around a portion of a sidewall of the p-type semiconductor layer. Extending the semiconductor material 32 to wrap around a portion of a sidewall of the p-type semiconductor layer 14 in this manner can increase the efficiency of the current path redirection from the main current path (i.e., electrode 1 to electrode 2) to the current redirection path (i.e., electrode 1 to electrode 3) by helping in extracting more electron-hole pairs from the light generating structure 16 (e.g., MQW) and the main p-n junction region 18.

As shown in FIG. 3, the SSLS 28 can also have a dielectric material 34 formed between the mesa structures formed in the SSLS that in one instance can include the n-type semiconductor layer 12, the light generating structure 16 and the p-type semiconductor layer 14, and in another instance can include the n-type semiconductor layer 12 and the electrode 20. In one embodiment, the region of semiconductor material 32 can extend from the sidewall of the p-type semiconductor layer 14 to a portion of a top surface of the dielectric material 34. The configuration of the semiconductor material 32 that is formed on the sidewall of the p-type semiconductor layer 14 and extends along a top surface of the dielectric material 34 enables structure planarization, thus increasing the production yield, and enables the sidewall contact between the semiconductor materials 32 and 14. In one embodiment, the dielectric material can include, but is not limited to, $SiO_2$, $Si_3N_4$, $Al_2O_3$, and/or the like.

The SSLS 28 of FIG. 3 can also include a substrate 36 for formation of the SSLS thereon. The substrate 36 can include one of a conductive substrate and an insulating substrate. Examples of material that can be used as the substrate 36 can include, but is not limited to, sapphire, silicon carbide (SiC), silicon (Si), GaN, AlGaN, AlON, $LiGaO_2$, diamond, glass, or another suitable material.

It is understood that the SSLS 28 as depicted in FIG. 3 is representative of one possible configuration and is not meant to limit the possibility of various other alternatives that may be utilized in order to attain the desired faster light modulation associated with this embodiment. As noted herein, the location of the n-type semiconductor layer 12 can be replaced with the p-type semiconductor layer 14, and vice versa. Also, the region of semiconductor material 30 can have the same conductivity type as the layer that it is formed thereunder, or it can have an opposite type of conductivity.

In addition, the amount of space that the region of semiconductor material 32 extends along the various layers (e.g., the p-type semiconductor layer 14 and the dielectric material 34) that it is formed on can vary from partial coverage to full coverage. Also, it is understood that the shape of the device regions of the SSLS 28 can take the form of various different geometries (e.g., including the circular shapes depicted in FIG. 2B).

Figure 4:
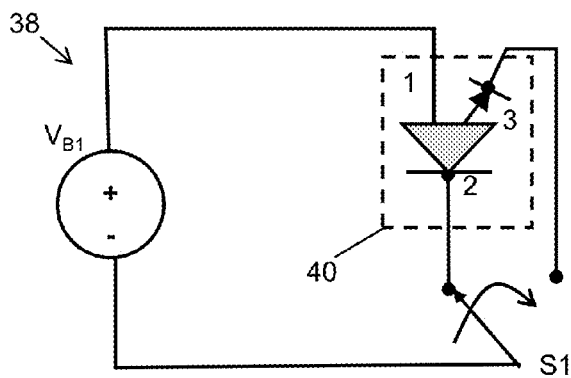
FIG. 4 shows an illustrative circuit diagram of a switching circuit that enables switching between the main p-n junction region and the supplementary p-n junction region in an SSLS according to an embodiment.

A switching circuit can be utilized with the SSLS 10, the SSLS 28 and any of the of other SSLS embodiments described herein to facilitate a switch from the main current path to the current redirection path. In this manner, the switching circuit can be configured to switch a bias applied to the main current path during a light emission state to the current redirection path during a light turn off-state. FIG. 4 shows an illustrative circuit diagram of a switching circuit 38 that enables switching between a main p-n junction region and a supplementary p-n junction region in an SSLS 40 according to an embodiment. In particular, the switching circuit 38 can switch a bias applied to the main current path from a voltage supply VBA during a light emission state to the current redirection path during a light turn off-state.

Figure 7:
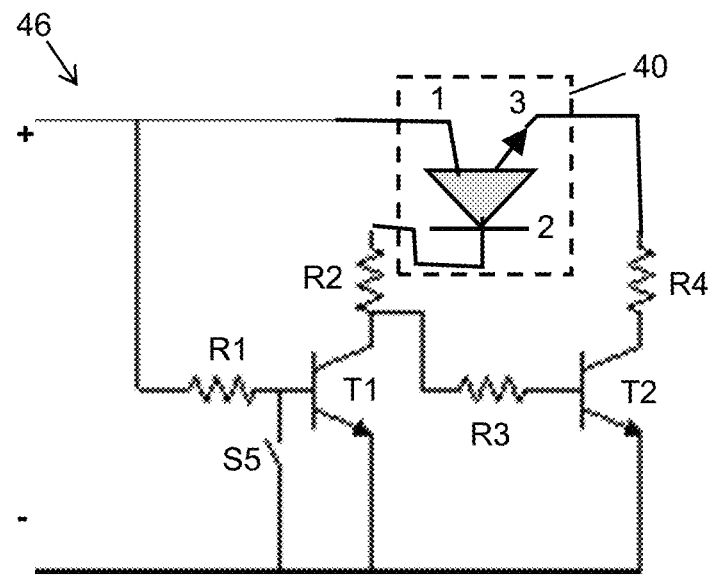
FIG. 7 shows an illustrative circuit diagram of a switching circuit that can use bipolar junction transistors or avalanche bipolar junction transistors to apply a bias to the supplementary p-n junction region in a forward direction, while disconnecting the main p-n junction region according to an embodiment.
Figure 8:
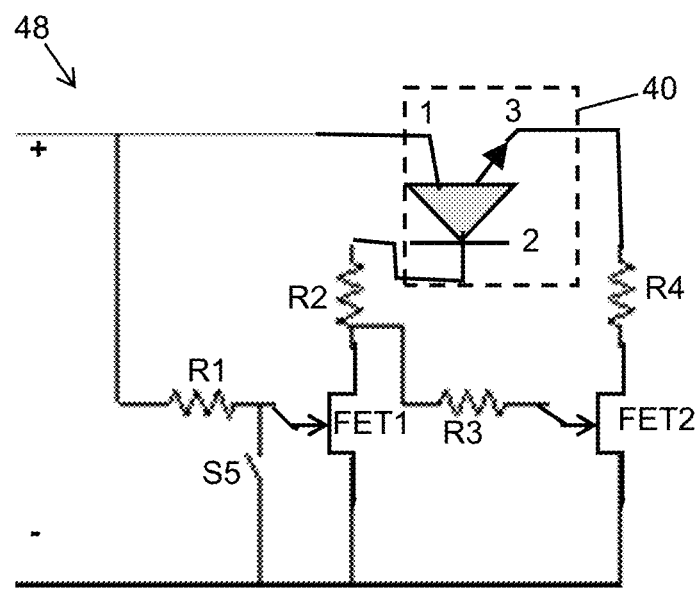
FIG. 8 shows an illustrative circuit diagram of a switching circuit that can use field-effect transistors (FETs) to apply a bias to the supplementary p-n junction region in a forward direction, while disconnecting the main p-n junction region according to an embodiment.
Figure 9:
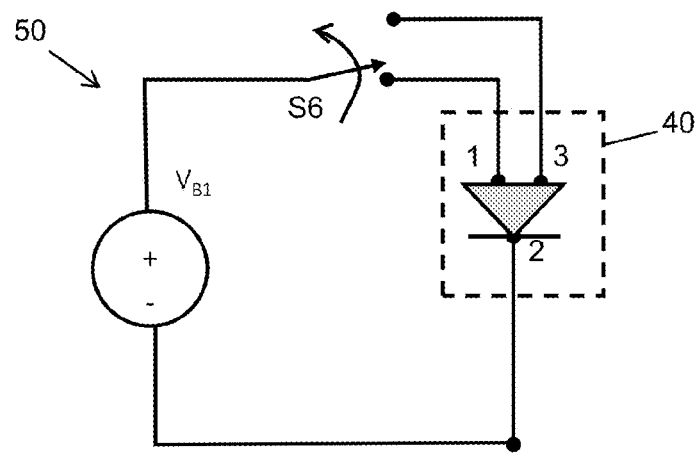
FIG. 9 shows an illustrative circuit diagram of a switching circuit for an SSLS having the main p-n junction region and the supplementary p-n junction region with a region of semiconductor material that is of the same conductivity type as the layer that is formed thereunder according to an embodiment.

Using the same reference numerals as depicted in FIGS. 2A-2B and 3, the main current path and the current redirection path in FIG. 4, as well as in FIGS. 5-9, can be represented as the path from electrode 1 to electrode 2, and the path from electrode 1 to electrode 3, respectively. Electrode 3 is depicted in FIG. 4, as well as in FIGS. 5-8, with a "small diode" with its arrowhead pointing in a direction opposite of the diode that forms the SSLS 40. This representation is an indication that the region of the semiconductor material that forms part of the supplementary p-n junction region contains a conductivity type that is opposite the conductivity type of the layer that it is formed there over. FIG. 9 differs from FIGS. 4-8 in that the electrode 3 is not depicted with a small diode having its arrowhead pointing in a direction opposite of the diode that forms the SSLS 40. This is an indication that the region of the semiconductor material that forms part of the supplementary p-n junction region in electrode 3 is of the same conductivity type as the layer that it is formed there over.

In operation, as shown in FIG. 4, the voltage supply $VB_1$ can apply a bias through the main current path in a forward direction during the light emission state when a switch S1 is set to form a path between electrode 1 and electrode 2. In the light turn-off state, the switch S1 changes the selection of the main current path to the current redirection path to form a path between electrode 1 and electrode 3. The voltage supply $VB_1$ can then apply the bias in a forward direction along the path formed from electrode 1 to electrode 3, while disconnecting the main current path between electrode 1 and electrode 2.

Figure 5:
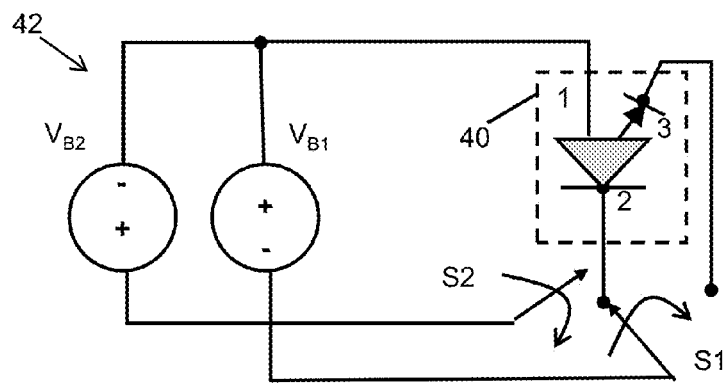
FIG. 5 shows an illustrative circuit diagram of a switching circuit that enables applying a bias to the supplementary p-n junction region in a forward direction, while applying the bias to the main p-n junction region in a reverse direction according to an embodiment.

FIG. 5 shows an illustrative circuit diagram of a switching circuit 42 that enables switching between the main p-n junction region and the supplementary p-n junction region in the SSLS 40 according to another embodiment. In FIG. 5, the switching circuit 42 can utilize two voltage supplies $V_{B1}$ and $V_{B2}$ along with two switches S1 and S2 to operate the SSLS 40 in either the light emission state or the light turn-off state. In this embodiment, the voltage supply $V_{B1}$ can apply a bias through the main current path in a forward direction during a light emission state when the switch S1 is set to form a path between electrode 1 and electrode 2. In a light turn-off state, the switch S1 changes the selection of the main current path to the current redirection path to form a path between electrode 1 and electrode 3. The voltage supply $V_{B1}$ can then apply the bias in a forward direction along the path formed from electrode 1 to electrode 3, while disconnecting the main current path between electrode 1 and electrode 2. In addition, the switch S2 can be positioned to form a path between electrode 1 and electrode 2. In this manner, the voltage supply $VB_2$ can apply a bias in a reverse direction to the main current path formed from electrodes 1 and 2. Applying a forward bias to the current redirection path between electrodes 1 and 3, while simultaneously applying a reversed bias to the main current path between electrodes 1 and 2 can further help to remove the accumulated electron-hole pairs from the main SSLS active region.

Figure 6:
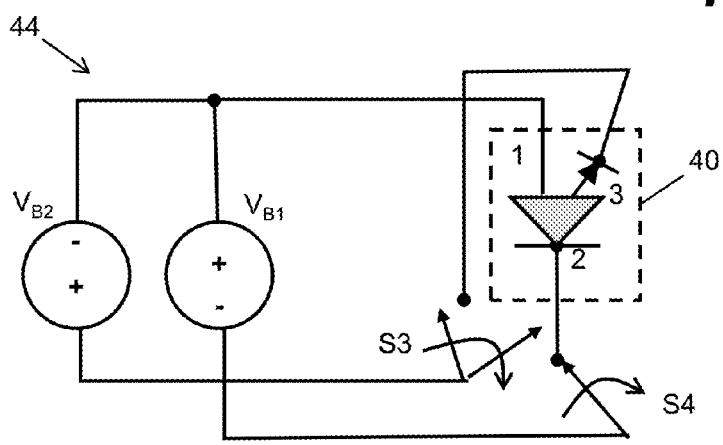
FIG. 6 shows an illustrative circuit diagram of a switching circuit that enables applying a bias to the supplementary p-n junction region in a reverse direction, while disconnecting the main p-n junction region according to an embodiment.

FIG. 6 shows an illustrative circuit diagram of a switching circuit 44 that enables switching between the main p-n junction region and the supplementary p-n junction region in the SSLS 40 according to still another embodiment. Like the switching circuit 42 of FIG. 5, the switching circuit 44 can use two voltage supplies $V_{B1}$ and $V_{B2}$ along with two switches S3 and S4 to operate the SSLS 40 in either the light emission state or the light turn-off state. In operation, the voltage supply $V_{B1}$ can apply a bias through the main current path in a forward direction during the light emission state when the switch S4 is set to form a path between electrode 1 and electrode 2. In the light turn-off state, the switch S4 is disconnected to cut-off the main current path between electrode 1 and electrode 2. In addition, the switch S3 is engaged to form another main current path between electrode 1 and electrode 2 and a current redirection path between electrode 1 and electrode 3. During this light turn-off state, the voltage supply $V_{B2}$ can then apply a bias in a reverse direction to both the path formed from electrode 1 to electrode 3, and the path formed between electrode 1 and 2. Disconnecting the main current path of electrode 1 to electrode 2 from the voltage supply $V_{B1}$, while using the switch S3 to form a current redirection path between electrodes 1 and 3, and another path between electrodes 1 and 2, and then using the voltage supply $V_{B2}$ to apply a bias in a reverse direction to both of these paths serves as a benefit to the light modulation of the SSLS 40. In particular, the reverse bias that is provided by this configuration creates a strong electric field in the supplemental p-n junction space-charge region of the SSLS 40. This strong electric field enables the accumulated electron-hole pairs to recombine at a faster rate, which translates to faster modulation in the light turn-off state.

FIG. 7 shows an illustrative circuit diagram of a switching circuit 46 that enables switching between the main p-n junction region and the supplementary p-n junction region in the SSLS 40 according to yet another embodiment. The switching circuit 46 can use resistors R1, R2, R3, and R4, transistors T1 and T2, and a switch S5 to provide light modulation time control of the SSLS 40. In one embodiment, the transistors T1 and T2 can include bipolar junction transistors or avalanche bipolar junction transistors. In one embodiment, the transistors T1 and T2 in conjunction with the resistors R1, R2, R3, and R4 and the switch S5, can be used to apply a bias in a forward direction to the supplementary p-n junction region of the SSLS 40, while disconnecting the main p-n junction region of the SSLS. In an embodiment, during a transition from a light emission state to a light turn-off state, the switch S5 attached to the base of the transistor T1 will close. The transistor T1 then goes into an off-state which disconnects the main current path formed between electrodes 1 and 2. The potential of the collector electrode of the transistor T1 will then increase. This removes the forward bias from the main p-n junction region of the SSLS 40. At the same time, there is an increase in collector potential. This opens the transistor T2, which makes it possible for the voltage source to provide a bias in the forward direction to the supplementary p-n junction region through the path formed between electrodes 1 and 3.

FIG. 8 shows an illustrative circuit diagram of another switching circuit 48 that enables switching between the main p-n junction region and the supplementary p-n junction region in the SSLS 40 according to an embodiment. The switching circuit 48 of FIG. 8 is similar to the switching circuit 46 of FIG. 7, except in this embodiment the transistors T1 and T2 are replaced by field-effect transistors FET1 and FET2, respectively. In one embodiment, the field-effect transistors FET1 and FET2 in conjunction with the resistors R1, R2, R3, and R4 and the switch S5, can be used to apply a bias in a forward direction to the supplementary p-n junction region of the SSLS 40, while disconnecting the main p-n junction region of the SSLS. The switching circuit 48 can operate in a similar manner to the switching circuit 46 of FIG. 7, provided that the field effect transistors used in the circuit are of a normally-off type.

FIG. 9 shows an illustrative circuit diagram of a switching circuit 50 for an SSLS 40 having a main p-n junction region and a supplementary p-n junction region with a region of semiconductor material that is of the same conductivity type as the layer that is formed thereunder according to an embodiment. As mentioned above, the electrode 3 is depicted in FIG. 9 without the small diode having an arrowhead pointing in a direction opposite of the diode that forms the SSLS 40. This is an indication that the region of the semiconductor material that forms part of the supplementary p-n junction region in electrode 3 is of the same conductivity type as the layer that it is formed there over.

In operation, as shown in FIG. 9, the voltage supply $VB_1$ can apply a bias through the main current path in a forward direction during the light emission state when a switch S6 is set to form a path between electrode 1 and electrode 2. In the light turn-off state, the switch S6 changes the selection of the main current path to the current redirection path to form a path between electrode 3 and electrode 2. As described herein, since the electrode 3 is connected to the semiconductor material 32 formed at the edges of the corresponding mesa, the light intensity in this switch position significantly decrease due to excessive non-radiative recombination. The voltage supply $VB_1$ can then apply the bias in a forward direction along the path formed from electrode 3 to electrode 2, while disconnecting the main current path between electrode 1 and electrode 2.

In the embodiment of FIG. 9, having the region of the semiconductor material in the supplementary p-n junction region with the same type of conductivity as the layer formed thereunder, and thus the main p-n junction region, the SSLS 40 will attain fast on/off switching. Like with the other embodiments described herein, the supplementary p-n junction region can have a smaller electron-hole life time than the electron-hole life time of the main p-n junction region. Therefore, when a switch is made from the main p-n junction region to the supplementary p-n junction region in response to a light turn-off state, and a bias is applied to the supplementary p-n junction region in the forward direction, the electron-hole pairs will be redirected from the main p-n junction region including the light generating structure to the supplementary p-n junction region. As a result, there will be a faster recombination of electron-hole pairs in the supplementary p-n junction region during this state than if in the main p-n junction region. This brings about a fast light modulation (e.g., light turn-off time).

In conventional LEDs, the minimal time to switch the light off is limited by the electron-hole recombination time. The requirement of achieving high LED efficiency is directly related to achieving higher material quality, which in turn, increases the electron-hole life time and pushes the LED turn-off times into nanosecond or even microsecond range. In an embodiment, the LED emission turns off not by recombination of the electron-hole pairs but rather by removal of existing electron-hole pairs from the LED active region by means of diffusion.

The switching times achievable with any of the various embodiments described herein can be estimated by using an ambipolar diffusion time. For example, the slowest time for the extraction of generated electron-hole pairs can be given by the ambipolar diffusion time which can be expressed as:

$$t_{AD} = r^2/D_{AD}, \quad (1)$$

where r is the largest distance for the electron hole pairs to travel and $D_{AD}$ is the ambipolar diffusion coefficient of electron-hole pairs in the main region of the SSLS.

Figure 10:
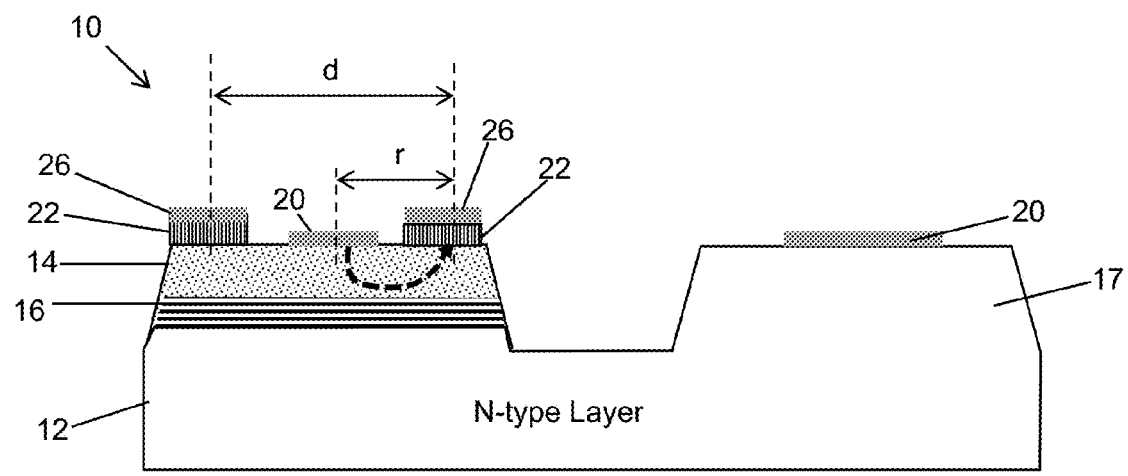
FIG. 10 shows a schematic cross-sectional view depicting a characteristic size of an SSLS element according to an embodiment.

The switching times that can be achieved as estimated by equation 1 can be explained further with an example that is described in reference to FIG. 10, which shows some of the characteristic sizes of the SSLS 10 (FIGS. 2A-2B). As shown in FIG. 10, the r value can be equal to the radius of the SSLS mesa 17, for an illustrative case of a round-shaped mesa design. For other mesa shapes, r would be the distance from the mesa center to the location of the additional electrodes extracting the electron-hole pairs.

In one embodiment, $D_{AD}$ is close to the diffusion coefficient of the slowest carrier type, in most cases being close to that of holes. For an illustrative example of a group III-nitride based LED, consider that $D_{AB} \approx 5$ cm$^2$/s. Taking r=0.5 µm, the ambipolar diffusion time can express as:

$$t_{AD} = (0.5e-4 \text{ cm})^2/5 = 5e-10 \text{ s} = 0.5 \text{ ns} \quad (2)$$

This example shows that, to achieve sub-nanosecond switching times, the characteristic size of a single SSLS element must not exceed a certain value, like 0.5 µm for a 0.5 ns switching time.

The actual switching time can be shorter than the above estimate because the electron-hole pair removing mechanism may not be purely due to diffusion as there can be electric field assistance. As a result, the above estimates provide the worst case scenario for the operation of any of the various embodiments described herein. Given that the required switching time is $t_{SW}$, the maximum size of a single SSLS element can be estimated as:

$$d_{MAX} = 2\sqrt{t_{SW} \times D_{AD}}, \quad (3)$$

where d is the diameter or width of a single element of the SSLS, and $d_{Max}$ is the maximum diameter for the element.

In other words, the diameter d of a single element of the SSLS 10 does not exceed the value given by two times a square root of the product of a required switching time $t_{SW}$ times the ambipolar diffusion coefficient $D_{AD}$ of electron-hole pairs in the main p-n junction region of the SSLS.

Figure 11:
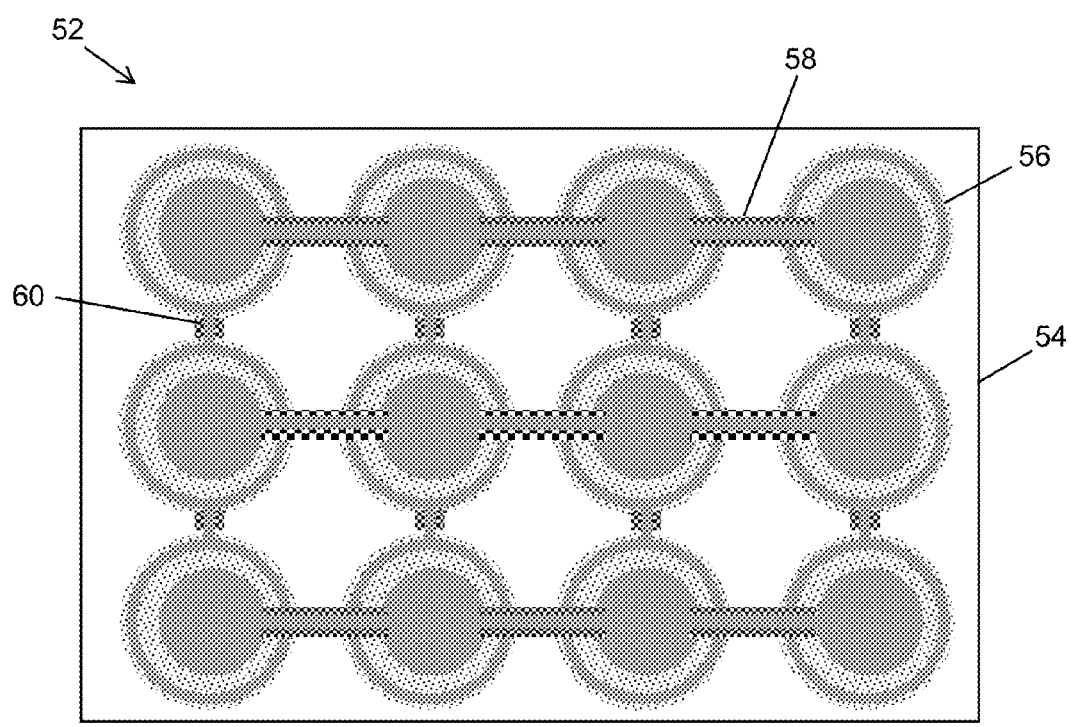
FIG. 11 shows a schematic of a large area SSLS with fast switching formed from a multi-pixel SSLS array according to an embodiment.

FIG. 11 shows a schematic of a large area SSLS 52 with fast switching formed from a multi-pixel SSLS array 54 according to an embodiment. In this embodiment, the multi-pixel SSLS array 54 can be formed from a plurality of interconnected SSLS elements 56. As shown in FIG. 11, each SSLS element 56 can be connected to adjacent SSLS elements by horizontally extending electrodes 58 and vertically extending electrodes 60. In one embodiment, each SSLS element 56 can take the form of any of the SSLSs depicted in FIGS. 2A-2B and 3. Although the multi-pixel SSLS array 54 is depicted with SSLSs that have a circular shape, it is understood that other geometries are possible for the SSLS elements 56. The SSLS elements 56 of the multi-pixel SSLS array 54 can also be configured with any of the switching circuits described herein to attain the fast modulation by having the supplementary p-n junction regions of the elements used to facilitate a faster recombination of electron-hole pairs in a light-turn-off state. This enables the large area SSLS 52 that is formed from the multi-pixel SSLS array 54 to have faster on-off switching. This capability makes the large area SSLS 52 well suited for SSLS applications that need really fast light modulation such as, for example, in communication systems.

Figure 12:
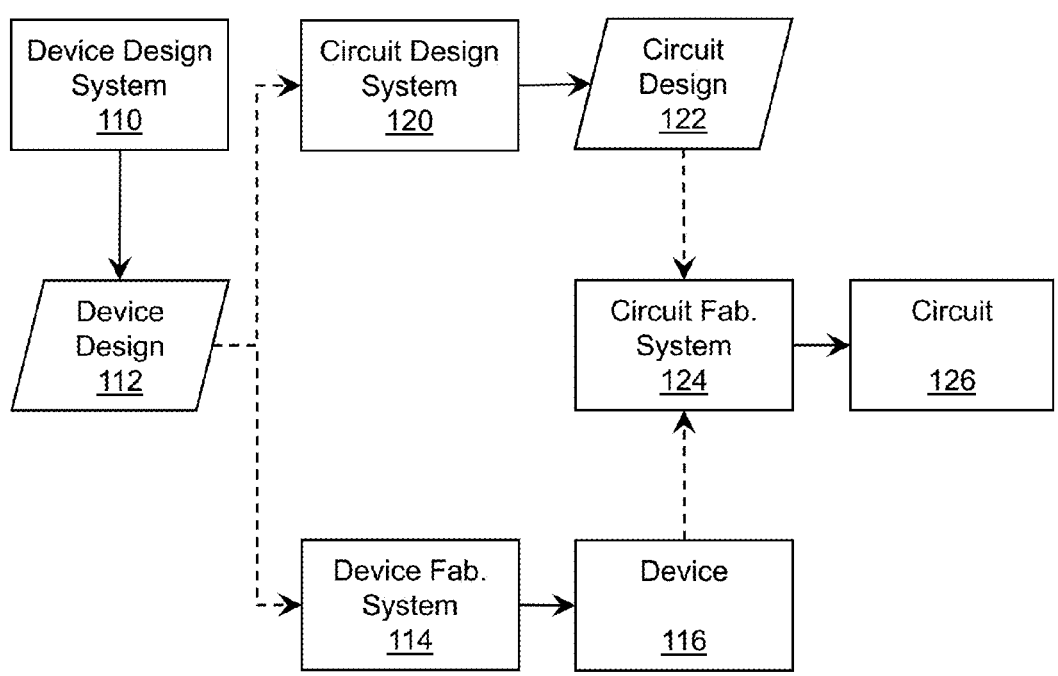
FIG. 12 shows an illustrative flow diagram for fabricating a circuit that comprises a SSLS with light modulation control according to one the various embodiments described herein.

In one embodiment, the invention provides a method of designing and/or fabricating a circuit that includes one or more of the devices designed and fabricated as described herein. To this extent, FIG. 12 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein. In either case, the corresponding fabrication system 114, 124, can include a robotic arm and/or electromagnet, which can be utilized as part of the fabrication process as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A solid-state light structure (SSLS) device, comprising:
   a main p-n junction region configured for recombination of electron-hole pairs for light emission; and
   a supplementary p-n junction region proximate the main p-n junction region to supplement the recombination of electron-hole pairs, the supplementary p-n junction region having a smaller electron-hole life time than an electron-hole life time of the main p-n junction region;
   wherein the electron-hole life time of the supplementary p-n junction region is 10 to 100 times smaller than the electron-hole life time of the main p-n junction region.

2. The SSLS device of claim 1, wherein the main p-n junction region and the supplementary p-n junction region operate cooperatively in a light emission state and a light turn-off-state, wherein the recombination of electron-hole pairs occurs in the main p-n junction region during a light emission state, and the recombination of electron-hole pairs occurs in the supplementary p-n junction region during the light turn off-state.

3. The SSLS device of claim 1, further comprising a pair of main electrodes formed over the main p-n junction region and a supplementary electrode formed over the supplementary p-n junction region, wherein the pair of main electrodes and the main p-n junction region form a main current path, and the supplementary electrode and one of the main electrodes along with the supplementary p-n junction region form a current redirection path.

4. The SSLS device of claim 1, wherein the main p-n junction region and the supplementary p-n junction region each comprise group III nitride materials.

5. The SSLS device of claim 1, wherein the SSLS device comprises one of a light emitting diode and a laser.

6. A device, comprising:
   a solid-state lighting structure (SSLS) including an n-type semiconductor layer; a p-type semiconductor layer; and a light generating structure formed between the n-type semiconductor layer and the p-type semiconductor layer;
   a main p-n junction region formed within the SSLS, for electron-hole pair recombination and light emission therefrom;
   at least one supplementary p-n junction region proximate the main p-n junction region to supplement the recombination of electron-hole pairs, the supplementary p-n junction region including a region of semiconductor material formed on a surface of one of the n-type semiconductor layer and the p-type semiconductor layer, and the supplementary p-n junction region including an electron-hole life time that is 10 to 100 times smaller than an electron-hole life time of the main p-n junction region;
   a pair of main electrodes formed over the main p-n junction region, wherein one of the electrodes is formed over the p-type semiconductor layer and another of the main electrodes is formed over the n-type semiconductor layer;
   a supplementary electrode formed over the supplementary p-n junction region;
   a main current path formed from the main p-n junction region and the pair of main electrodes; and
   a current redirection path formed from the supplementary electrode and one of the main electrodes along with the supplementary p-n junction region.

7. The device of claim 6, further comprising a voltage supply configured to apply a bias through the main current path to the main p-n junction region in a forward direction during a light emission state.

8. The device of claim 7, further comprising a switching circuit configured to switch the bias applied by the voltage supply from the main current path to the current redirection path to the supplementary p-n junction region during a light turn-off state.

9. The device of claim 8, wherein the switching circuit enables the voltage supply to apply a bias to the supplementary p-n junction region in a forward direction in the light turn-off state while disconnecting the main current path.

10. The device of claim 8, wherein the switching circuit enables the voltage supply to apply a bias to the main p-n junction region in a reverse direction while simultaneously applying a bias to the supplementary p-n junction region in a forward direction in the light turn-off state.

11. The device of claim 8, wherein the switching circuit enables the voltage supply to apply a bias to the main p-n junction region in a reverse direction while simultaneously applying a bias to the supplementary p-n junction region in a reverse direction in the light turn-off state.

12. The device of claim 8, wherein the switching circuit comprises one of a bipolar junction transistor, an avalanche bipolar junction transistor, or a field-effect transistor.

13. The device of claim 6, wherein the region of semiconductor material of the supplementary p-n junction region comprises an opposite type of conductivity as the layer formed thereunder.

14. The device of claim 6, wherein the region of semiconductor material of the supplementary p-n junction region comprises a same type of conductivity as the layer formed thereunder.

15. The device of claim 6, wherein the current redirection path includes a higher defect concentration than the main current path.

16. The device of claim 6, wherein the region of semiconductor material of the supplementary p-n junction region is formed on a portion of a top surface of one of the n-type semiconductor layer and the p-type semiconductor layer, and extends along the top surface and wraps around a portion of a sidewall thereof.

17. The device of claim of claim 6, further comprising a substrate for formation of the SSLS thereon, wherein the substrate comprises one of a conductive substrate or an insulating substrate.

18. A method, comprising:
 fabricating a device, comprising:
  a solid-state lighting structure (SSLS) including an n-type semiconductor layer; a p-type semiconductor layer; and a light generating structure formed between the n-type semiconductor layer and the p-type semiconductor layer;
  a main p-n junction region formed within the SSLS, for electron-hole pair recombination and light emission therefrom;
  at least one supplementary p-n junction region proximate the main p-n junction region to supplement the recombination of electron-hole pairs, the supplementary p-n junction region including a region of semiconductor material formed on a surface of one of the n-type semiconductor layer and the p-type semiconductor layer, and the supplementary p-n junction region including an electron-hole life time that is 10 to 100 times smaller than an electron-hole life time of the main p-n junction region;
  a pair of main electrodes formed over the main p-n junction region, wherein one of the electrodes is formed over the p-type semiconductor layer and another of the main electrodes is formed over the n-type semiconductor layer;
  a supplementary electrode formed over the supplementary p-n junction region;
  a main current path formed from the main p-n junction region and the pair of main electrodes; and
  a current redirection path formed from the supplementary electrode and one of the main electrodes along with the supplementary p-n junction region.

19. The method of claim 18, further comprising fabricating a circuit including the device, wherein the circuit includes:
 a voltage supply configured to apply a bias through the main current path to the main p-n junction region in a forward direction during a light emission state; and
 a switching circuit configured to switch the bias applied by the voltage supply from the main current path to the current redirection path to the supplementary p-n junction region during a light turn-off state.

\* \* \* \* \*